United States Patent
Nagata

(10) Patent No.: US 12,113,105 B2
(45) Date of Patent: Oct. 8, 2024

(54) SEMICONDUCTOR DEVICE

(71) Applicant: RENESAS ELECTRONICS CORPORATION, Tokyo (JP)

(72) Inventor: Nao Nagata, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 420 days.

(21) Appl. No.: 17/720,711

(22) Filed: Apr. 14, 2022

(65) Prior Publication Data

US 2023/0335590 A1    Oct. 19, 2023

(51) Int. Cl.
*H01L 29/08* (2006.01)
*H01L 29/06* (2006.01)
*H01L 29/10* (2006.01)
*H01L 29/739* (2006.01)

(52) U.S. Cl.
CPC ........ *H01L 29/083* (2013.01); *H01L 29/0696* (2013.01); *H01L 29/1095* (2013.01); *H01L 29/7397* (2013.01)

(58) Field of Classification Search
CPC .............. H01L 29/083; H01L 29/0696; H01L 29/1095; H01L 29/7397
USPC ......................................................... 257/144
See application file for complete search history.

(56) References Cited

U.S. PATENT DOCUMENTS 10,505,029 B2    12/2019  Nagata
2016/0359026 A1*  12/2016  Matsuura .......... H01L 29/66348
2019/0035920 A1*   1/2019  Nagata ................. H01L 29/407

FOREIGN PATENT DOCUMENTS

JP        2017-029434 A     2/2019

* cited by examiner

*Primary Examiner* — Igwe U Anya
(74) *Attorney, Agent, or Firm* — Rimon P.C.

(57) ABSTRACT

A semiconductor device includes first and second active cell regions and an inactive cell region between the first and second active cell regions, wherein each of the first and second active cell regions comprises: a trench gate; a first trench emitter; a first hole barrier layer of a first conductivity type formed between the trench gate and the first trench emitter; a base layer of a second conductivity type formed on upper portion of the first hole barrier layer; an emitter layer of the first conductivity type formed on upper portion of the base layer; a latch-up prevention layer of the second conductivity type formed on upper portion of the first hole barrier layer, wherein the inactive cell region comprises: a second trench emitter; a first floating layer of the second conductivity type formed between the trench gate of the first active cell region and the second trench emitter.

13 Claims, 11 Drawing Sheets

SEMICONDUCTOR DEVICE

BACKGROUND

The present invention relates to a semiconductor device, and more particularly, the present invention relates to a semiconductor device including IGBT (Insulated Gate Bipolar Transistor).

Trench-gate IGBT are widely used as IGBT with lower on-resistance, i.e., lower forward-saturation-voltage Vce (Vsat). And An IE-type IGBT utilizing IE (Injection Enhancement) effect has been developed with the purpose of reducing the conduction resistance and on-voltage in the on-state of the trench gate type IGBT. In the IE-type IGBT, active cells and inactive cells, in which floating layers are formed, are alternately arranged. By providing the floating layer, holes are less likely to be discharged from the emitter electrodes when IGBT is in the on-state, and the concentration of carriers (holes) accumulated in the drift layer can be increased.

Patent Document 1 discloses a technique relating to a GE-S type IGBT as the IE-type IGBT. GE-S type IGBT can improve IE effects by narrowing pitches as compared with the GG type or EGE type IGBT. Further, in GE-S type IGBT, not only the trench gate electrode but also the trench emitter electrode is in contact with the P-type floating region. Since a parasitic Pch-type MOSFET is formed by the P-type body contact region (P-type latch-up preventing region), the N-type hole barrier region and the P-type floating region, it is possible to discharge the accumulated carriers at turn-on by the parasitic Pch-type MOSFET. Therefore, GE-S type IGBT can both improve the IE effect and suppress the turn-off loss. Further, since a potential variation of the P-type floating region is suppressed by the carrier discharge by the parasitic Pch-type MOSFET, it is possible to suppress a variation of the gate potential caused by the P-type floating region.

Patent Document 1 further, it is described to provide a trench emitter electrode between the trench gate electrode and the P-type floating region (FIG. 42). By the trench gate electrode is separated from the P-type floating region, it is possible to further suppress the fluctuation of the gate potential caused by the P-type floating region.

PRIOR-ART DOCUMENT

Patent Document

[Patent Document 1] Japanese Unexamined Publication Laid-Open No. 2019-29434

SUMMARY

As one of the problems of IGBT, a self-turn-on phenomenon is known. The self-turn-on phenomenon of IGBT will be described with reference to FIG. 11. FIG. 11 is a schematic diagram of a system that provides power to a load by IGBT 1 of the high side and IGBT 2 of the low side. IGBT 1 and IGBT 2 are controlled by a gate driver (in FIG. 11, IGBT 1 gate driver is omitted). As a basic operation, IGBT 2 is turned off while IGBT 1 is on, and IGBT 1 is turned off while IGBT 2 is on.

In IGBT, parasitic capacitances CGC between a gate and a collector and CGE between the gate and an emitter are structurally formed. As shown in FIG. 11, when IGBT 1 is turned on, VCE increases and the currents i1, i2 flow through the parasitic capacitances CGC, CGE. Thus, as VCE increases, VGE also increases. When VGE exceeds a threshold, IGBT 2 is activated. This is the self-turn-on phenomenon.

Patent Document 1 describes a technique for suppressing the variation of the gate potential, but does not disclose an improvement measure for the self-turn-off and the parasitic capacitances.

There is a need for a technique for solving the self-turn-on problem without degrading the IF-effect of IGBT or the like.

Other objects and novel features will become apparent from the description of the specification and drawings.

A semiconductor device according to one embodiment includes a semiconductor substrate having a first surface and a second surface opposite to the first surface; and a drift layer of a first conductivity type formed on the semiconductor substrate, wherein the semiconductor substrate has first and second active cell regions, and an inactive cell region between the first and second active cell regions, wherein each of the first and second active cell regions comprises: a trench gate formed on the first surface side; a first trench emitter formed adjacent to the trench gate on the first surface side; a first hole barrier layer of the first conductivity type formed on upper portion of the drift layer and between the trench gate and the first trench emitter; a base layer of a second conductivity type opposite to the first conductivity type formed on upper portion of the first hole barrier layer and in contact with the trench gate; an emitter layer of the first conductivity type formed on upper portion of the base layer and in contact with the trench gate; and a latch-up prevention layer of the second conductivity type formed on upper portion of the first hole barrier layer and in contact with the first trench emitter, wherein the inactive cell region comprises: a second trench emitter formed adjacent to the trench gate of the first active cell region on the first surface side; and a first floating layer of the second conductivity type formed between the trench gate of the first active cell region and the second trench emitter.

In the semiconductor device according to an embodiment, it is possible to suppress the self-turn-on phenomenon of IGBT.

DETAILED DESCRIPTION

Figure 1:
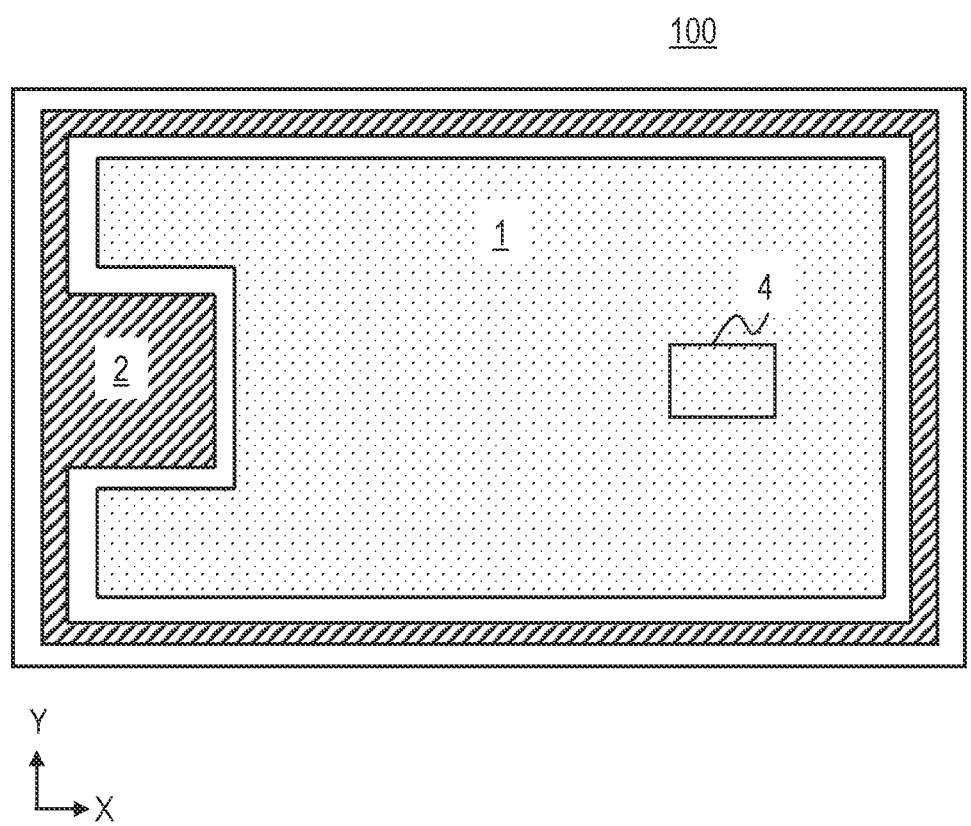
FIG. 1 is a plan view of a semiconductor device of a first embodiment.

Hereinafter, a semiconductor device according to an embodiment will be described in detail by referring to the drawings. In the specification and the drawings, the same or corresponding form elements are denoted by the same reference numerals, and a repetitive description thereof is omitted. In the drawings, for convenience of description, the configuration may be omitted or simplified. Also, at least some of the embodiments may be arbitrarily combined with each other.

First Embodiment (Configuration of Semiconductor Device)

FIG. 1 is a plan view of a semiconductor device (IGBT chip) 100 of the first embodiment. In FIG. 1, an insulating film is made transparent for simplicity of understanding. As shown in FIG. 1, most of the surface of the semiconductor device 100 is covered with an emitter electrode 1. Gate electrode 2 is formed so as to surround the emitter electrode 1. Further, the collector electrode 3 is formed on the back surface of the semiconductor device 100. An emitter potential is supplied to the emitter electrode 1 and a gate potential is supplied to the gate electrode 2.

Figure 2:
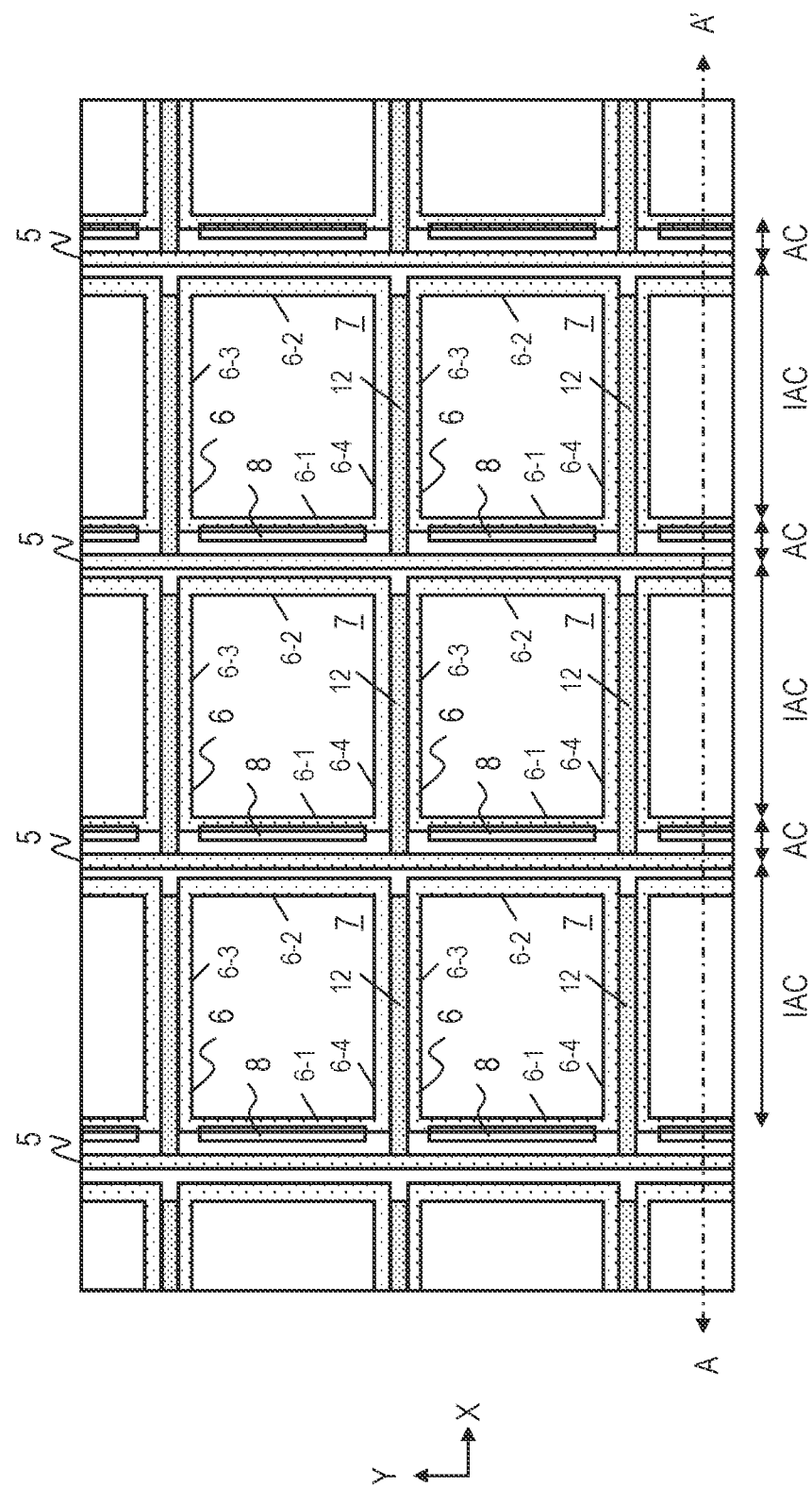
FIG. 2 is a plan view of the semiconductor device of the first embodiment.
Figure 3:
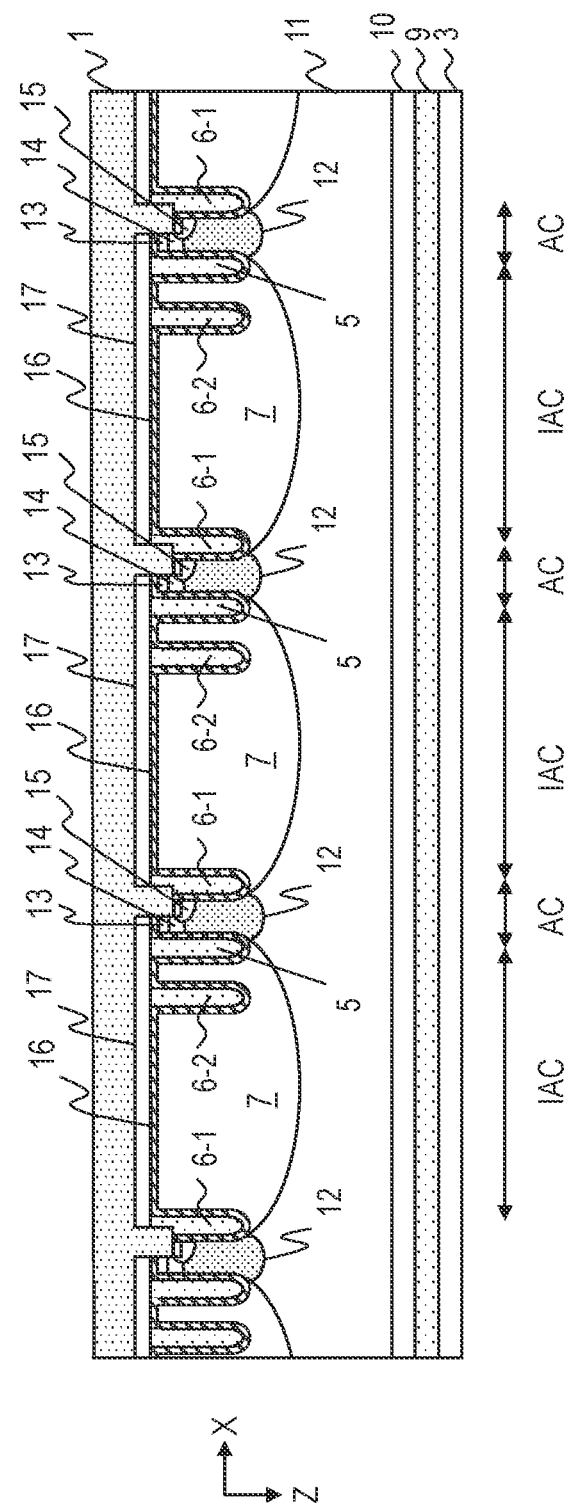
FIG. 3 is a cross-sectional view of the semiconductor device of the first embodiment.

FIG. 2 is an enlarged plan view of the region 4 of FIG. 1. FIG. 3 is a cross-sectional view taken along A-A' of FIG. 2. IGBT of the first embodiment is a GE-S type (GE type shrink-structure) which is a type of IE type IGBT. As shown in FIGS. 2 and 3, the semiconductor device 100 includes the emitter electrode 1, the collector electrode 3, p+ type collector layer 9, n+ type field stop layer 10 and n− type drift layer 11 formed on a semiconductor substrate.

As shown in FIG. 2, an active cell region AC and an inactive cell region IAC are alternately formed on the semiconductor substrate.

A trench gate (also referred to as a gate potential trench) 5 to which the gate potential is supplied and a trench emitter (also referred to as an emitter potential trench) 6 to which the emitter potential is supplied are further formed on the semiconductor substrate. As shown in FIG. 1, the trench gate 5 has a shape extending along the Y-axis. Trench emitter 6 is a square shape in a plan view. Each side of the trench emitter 6 is called as 6-1, 6-2, 6-3, 6-4, respectively. Between the trench gate 5 and the trench emitter 6-1 facing the trench gate 5, n+ type hole barrier layer 12 is formed. The part surrounded by the trench gate 5 and the trench emitter 6-1 the operating area of IGBT, i.e., the active cell area AC.

In the active cell area AC, the trench emitter 6-1 is connected to the emitter electrode 1 through a contact hole. The emitter electrode 1 is connected to a p+ type latch-up prevention layer 15 via the contact hole and a body contact (upper portion of the p+ type latch-up prevention layer 15). An n+ type emitter layer 13 and a p+ type base layer 14 are formed so as to contact the trench gate 5.

A p+ type floating layer 7 is formed in the inactive cell region IAC. Trench emitters 6-2, 6-3, 6-4 are formed in the inactive cell region IAC. The p+ type floating layer 7 extends to a portion of the bottom of each of the trench gate 5, trench emitters 6-1, 6-3, and 6-4. The trench emitter 6-2 is formed to a depth halfway through the p+ type floating layer 7. An n+ type hole barrier layer 12 is formed between the trench emitters 6-3 and 6-4. Incidentally, 8 in FIG. 1 is a body contact, 16 in FIG. 2 is a gate insulating film, 17 is an interlayer insulating film.

Next, the trench emitter 6, which is a feature of the first embodiment, will be described. As described above, in the first embodiment, the trench emitter 6 has the square shape in a plan view. Considering the trench emitter 6 in four parts (6-1, 6-2, 6-3, 6-4), it can be decomposed as follows. No. 1: Trench gate 5 and trench emitter 6-1. No. 2: Trench gate 5 and trench emitter 6-2. No. Trench emitters 6-3, 6-4 and p+ type floating layer 7. The No. 1 denotes a conventional GE-S type IGBT. The operation is also the same as that of the conventional GE-S type IGBT. The No. 2 denotes a portion which influences the parasitic capacitances and the gate capacitance. The No. 3 denotes a portion which influences the parasitic P-channel type MOSFET.

Figure 4:
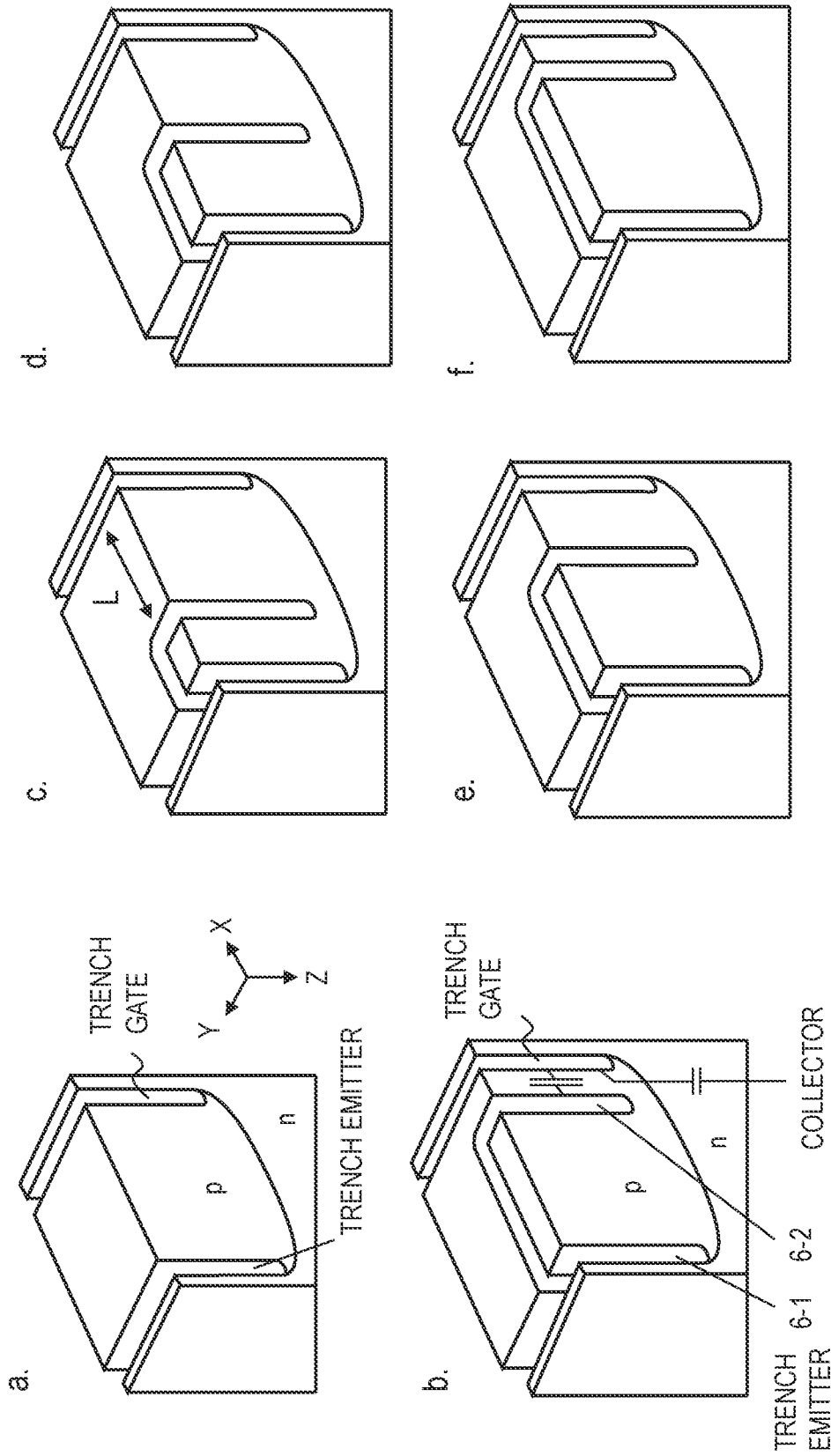
FIG. 4 is a three-dimensional view of the semiconductor device of the first embodiment.

First, the influences on the parasitic capacitances (The No. 2) will be described. FIG. 4 is a stereoscopic view of an enlarged peripheral of the trench gate 5 and the trench emitter 6. "a" in FIG. 4 is the structure of a conventional IGBT, "b" is the structure of IGBT of the first embodiment. A difference between the conventional and the first embodiment is the trench emitter 6-2. As shown in "b" of FIG. 4, in the first embodiment, a parasitic capacitance contributing to the parasitic capacitance CGE is formed by the trench gate 5, the trench emitters 6-2, and the p-layer (floating layer). The trench gate 5, the p-layer (floating layer 7), the n-layer (drift layer 11), and the collector electrode 3 (not shown) form a parasitic capacitance contributing to the parasitic capacitance CGC. In the following, the parasitic capacitance that contributes to the parasitic capacitance CGE and the parasitic capacitance that contributes to the parasitic capacitance CGC are treated as the parasitic capacitance CGE, CGC respectively.

Figure 11:
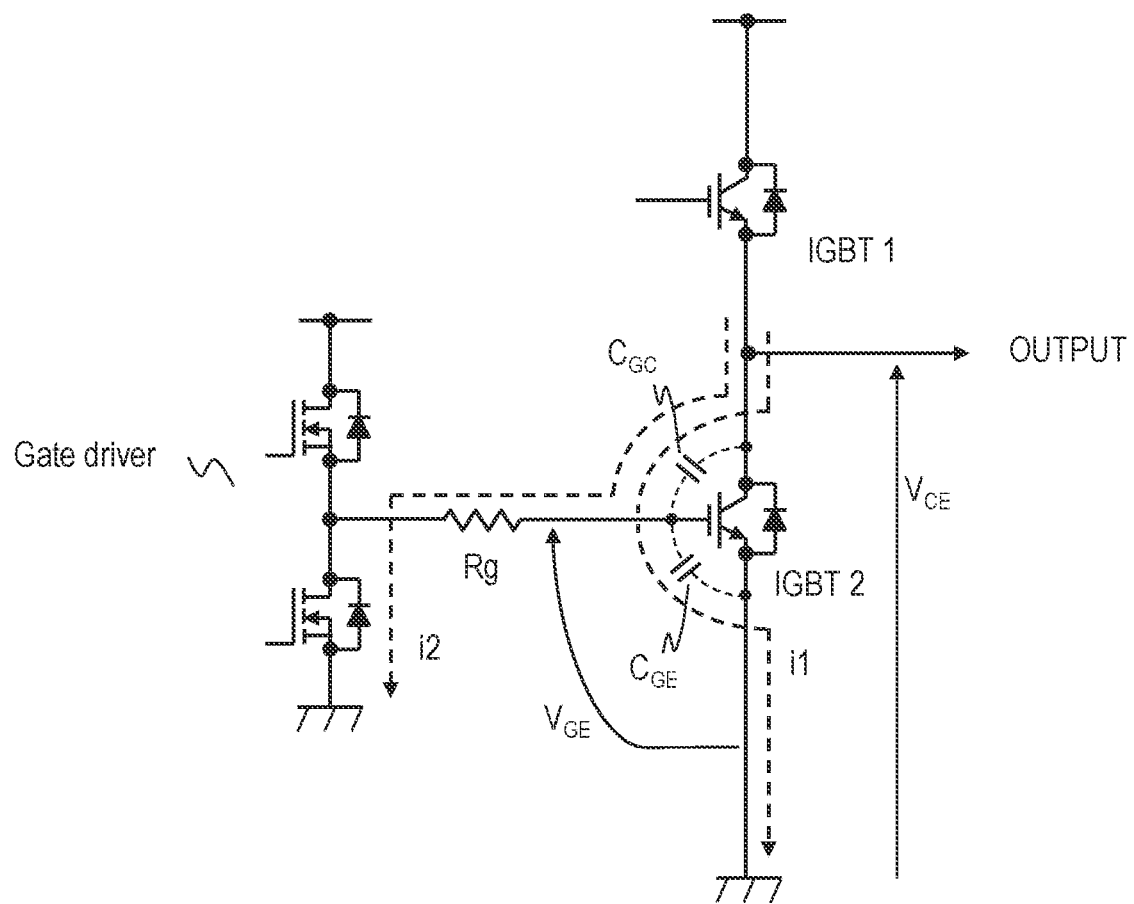
FIG. 11 is a diagram for explaining the self-turn-on phenomena of IGBT.

Here, the parasitic capacitance will be described again with reference to FIG. 11. When current i1 flows, VGE is expressed by the following equation.

$$V_{GE} = \frac{C_{GC}}{C_{GE} + C_{GC}} * V_{CE}$$

When the current i2 flows, VGE is expressed by the following equation.

$$V_{GE} = Rg * C_{GC} \frac{dV_{CE}}{dt}$$

A self-turn-on phenomenon occurs when VGE is increased (above the thresholds), as described above. Therefore, to suppress the self-turn-on phenomenon, it is sufficient to suppress the increase VGE. To suppress the increase in VGE, increase CGE/CGC and reduce CGC, i.e., increase CGE and reduce CGC.

Figure 5:
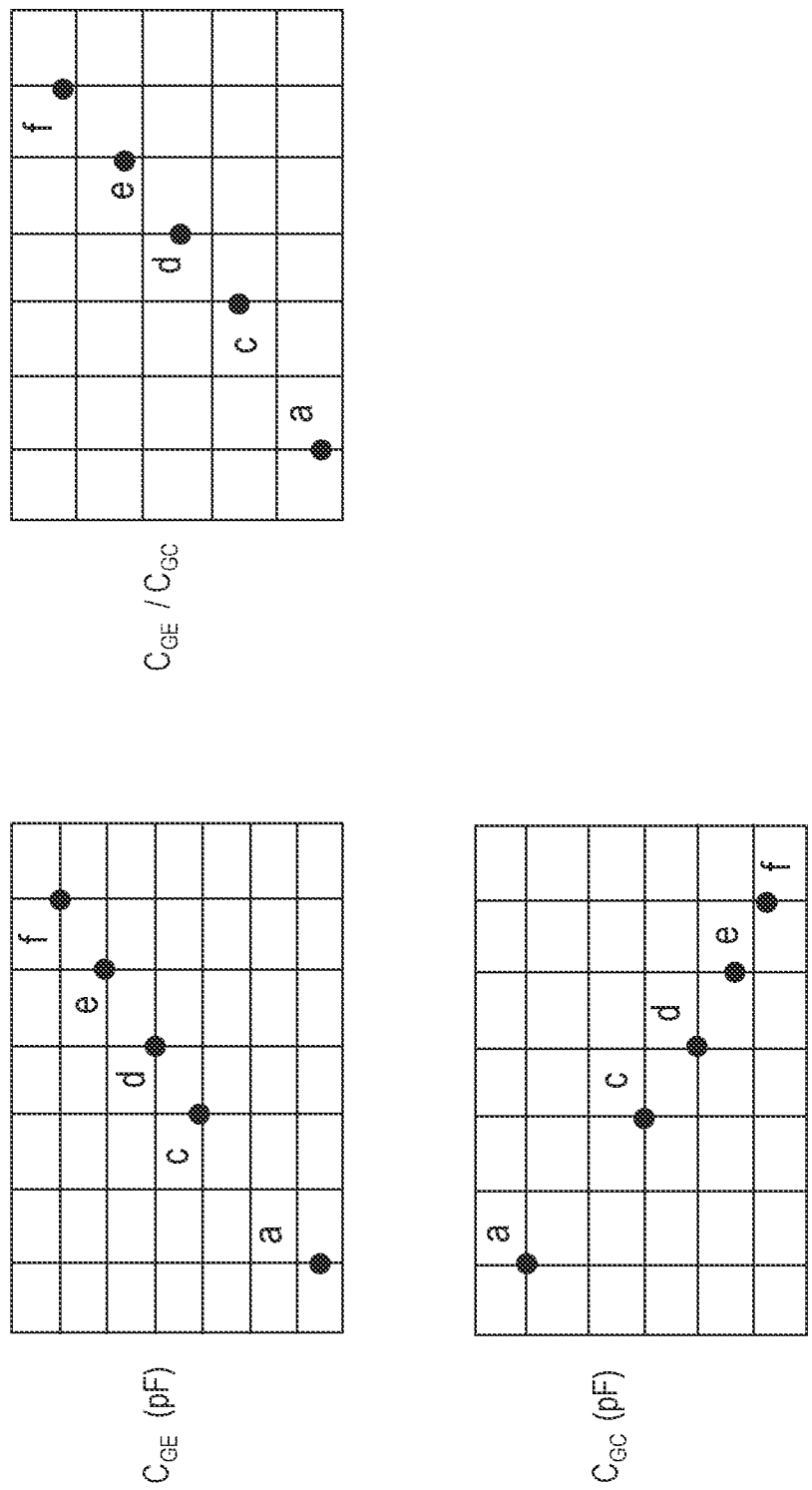
FIG. 5 is a diagram for explaining the semiconductor device of the first embodiment.

Returning to FIG. 4 again, the description will be made. As is apparent from "a" and "b" in FIG. 4, in the first embodiment, the trench gate 5 and the trench emitter 6-2 forming CGE are close to each other. Also, p-layer (floating layer) for forming CGC is narrow. Therefore, CGE becomes larger and CCC becomes smaller than the conventional one. A relation between a distance between the trench gate 5 and the trench emitter 6-2 and the parasitic capacitance CGE, CGC will be further described with reference FIG. 5. FIG. 5 is the result of simulating the parasitic capacitance (simulated condition: gate voltage 0 V, switching frequency 1 MHz) with TCAD (Technology CAD) by changing the distance L between trench gate 5 and trench emitter 6-2. Simulated at four distances Ls, as shown by c-f in FIG. 4. As shown in FIG. 5, it can be seen that "f" with the shortest distance L has the largest CGE and the smallest CGC. Therefore, the distance between the trench gate 5 and the trench emitter 6-2 is preferably, for example, 1 to 2 μm or less. At least, it is desirable that the distance between the trench gate 5 and the trench emitter 6-2 is shorter than the distance between the trench emitters 6-1 and 6-2.

As described above, in the first embodiment, the self-turn-on phenomenon can be suppressed by improving the parasitic capacitance by the trench emitter 6-2. Even in the prior art, for example, in a of FIG. 4, it may be possible to obtain a similar effect by narrowing a width of the p-layer (floating layer) and shortening the distance between the trench gate and the trench emitter. However, if the width of the floating layer is narrowed, the IE effect is lowered. On the other hand, in the first embodiment, it is possible to suppress the self-turn-on phenomenon without decreasing the IE effect.

Patent Document 1 also discloses forming a trench emitter in the vicinity of a trench gate (FIG. 42, FIG. 45, FIG. 54, FIG. 57, and FIG. 59). However, between Patent Document 1 and the first embodiment, the configuration, the purpose, and the effect are completely different. In Patent Document 1, n+ type layer (hole barrier layer) is formed between the trench gate and the trench emitter. In the first embodiment, the p+ type floating layer 7 is formed between the trench gate 5 and the trench emitter 5-2. This difference affects parasitic capacitances CGE and CGC. As described above, in the first embodiment, the parasitic capacitances CGE and CGC are formed by the trench gates 5, the p+ layer (floating layer 7), the n− layer (drift layer 11), and the collector electrode 3. In Patent Document 1, only the parasitic capacitance CGC is formed by the trench gate, the n+ layer (hole barrier layer), the n− layer (drift layer), and the collector electrode. At this time, the parasitic capacitance CGE of the first embodiment is larger, the parasitic capacitance CGC of the first embodiment is smaller. Because, in the first embodiment, the pn junction is formed by the p+ layer (floating layer 7) and the n− layer (drift layer 11). A depletion layer is formed at the pn junction, but the depletion to the p-layer side does not evolve in the p-layer because a concentration on the p-layer side is higher in the case of the junction of the p+ layer and the n− layer. At this time, the parasitic capacitance CGE is formed, parasitic capacitance CGC is formed through the pn junction capacitance. The parasitic capacitance CGC is reduced because a region of the pn-junction is small. On the other hand, in the structure of the patent document the parasitic capacitance CGE is not formed because there is no p+ layer. Therefore, in the structure of the patent document difficult to increase the parasitic capacitance CGE than the first embodiment and reduce the parasitic capacitance CGC than the first embodiment.

Figure 6:
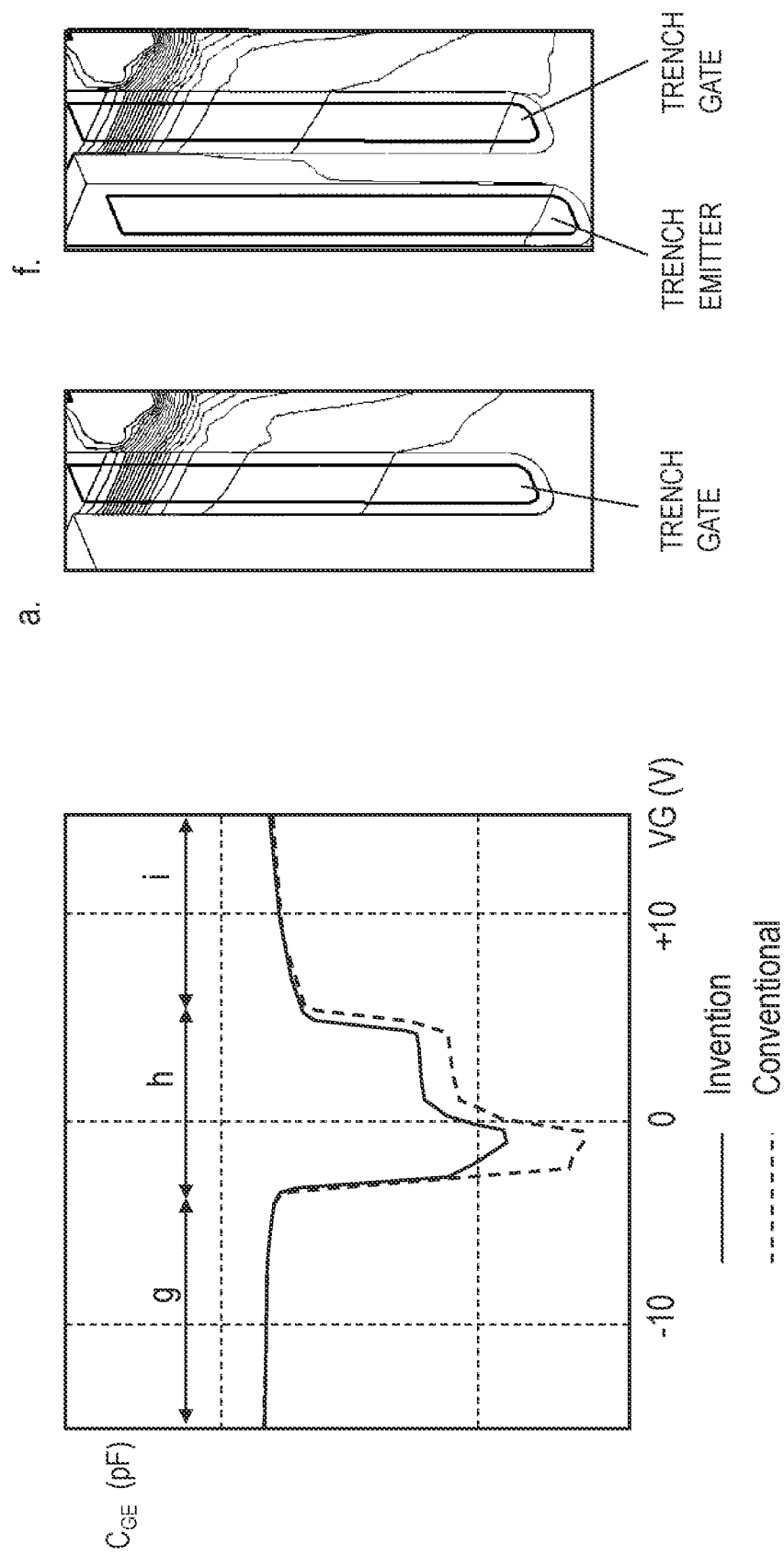
FIG. 6 is a diagram for explaining the semiconductor device of the first embodiment.

Next, the influence on the gate capacitance will be described. Generally, it is known that the gate capacitance changes with the voltage applied to the gate in the MOS structure. Description will be made with reference to FIG. 6. The graph on the left of FIG. 6 is a graph showing the relationship between the gate voltage and the gate capacitance. When a negative voltage is applied to the gate, holes, which are majority carriers of the p+ type base layer 15, are attracted to the boundary between the gate oxide and the base layer. In this state, the gate oxide film constitutes a capacitor, the gate capacitance becomes the capacitance of the gate oxide film ("g" region in the graph). When the gate voltage becomes a positive voltage from near 0 v, the holes are away from the boundary between the gate oxide and the base layer, a depletion layer is formed at the boundary between the gate oxide and the base layer. In this state, the capacitor of the gate oxide film and the capacitor of the depletion layer are in series, the gate capacitance is lowered than the capacitance of the gate oxide film ("h" region in the graph). When a larger positive voltage is applied to the gate, minority-carrier electrons are attracted to the boundary between the gate oxide and the base layer to form an inversion layer. In this state, the gate oxide film constitutes a capacitor, the gate capacitance becomes the capacitance of the gate oxide film ("i" region in the graph). Therefore, in the prior art, the relationship between the gate voltage and the gate capacitance becomes a graph as shown by a broken line in FIG. 6.

On the other hand, in the first embodiment, the trench emitter 6-2 is formed in the vicinity of the trench gate 5. By the effect of the trench emitter 6-2 described above, the variation of the gate capacitance with respect to the gate voltage can be reduced. Graph shown by the solid line in FIG. 6 is a result of simulating by TCAD for the structure of the first embodiment. As shown in the graph, as compared to the prior art, the variation of the gate capacitance with respect to the gate voltage is reduced. The small gate capacitance variation with respect to the gate voltage means that the response speed to the gate voltage is increased. Therefore, the first embodiment can suppress switching loss (turn-on loss and turn-off loss) as compared with the conventional case.

The right-hand view of FIG. 6 is a diagram illustrating the effectiveness of the trench emitter 6-2 from another point of view, simulating the potential near the gate trench 5 by TCAD, "a" is the prior art, "f" is the simulation result of the first embodiment. Comparing "a" and "f", the equipotential line density between the trench gate and the trench emitter is increased in "f" (a potential difference is generated). The charge response speed of "f" can be increased by this potential difference. The trench emitter 6-2 also mitigates the electric field at the bottom of the trench gate. The electric field mitigation suppresses a dynamic avalanche generation which becomes a problem in IGBT, and it leads to the suppression of the effect by a hot carrier.

Next, the parasitic Pch-type MOSFET (The No. 3) will be described. In the conventional. GE-S type IGBT, the trench gate and the trench emitter are formed parallel to the Y-axis direction. In FIG. 2, there is a trench emitter corresponding to the trench emitter 6-1, and there are no trench emitters 6-2, 6-3, and 6-4. In this instance, a parasitic Pch-type MOSFET is formed around the trench emitter 6-1. Specifically, the parasitic Pch-type MOSFET is formed by the p+ type body contact (p+ type latch-up preventing layer 15) contacting the trench emitter 6-1, the n+ type hole barrier layer 12, and the p+ type floating layer 7. On the other hand, in the first embodiment, since the hole barrier layer 12 of the type is also formed between the trench emitters 6-3 and 6-4, the parasitic Pch-type MOSFETs are formed not only around the trench emitter 6-1 but also around the trench emitters 6-3 and 6-4. Specifically, the parasitic Pch-type MOSFET is formed by the p+ type body contact (p+ type latch-up preventing layer 15) contacting the trench emitter 6-1, the n+ type hole barrier layer 12 between the trench emitters 6-3 and 6-4 and the p+ type floating layer 7 contacting the trench emitter 6-3 or 6-4. Therefore, in the first embodiment, the region in which the parasitic Pch-type MOSFETs are formed is wider than in the conventional GE-S type IGBT, and the turn-off speed can be increased.

Figure 7:
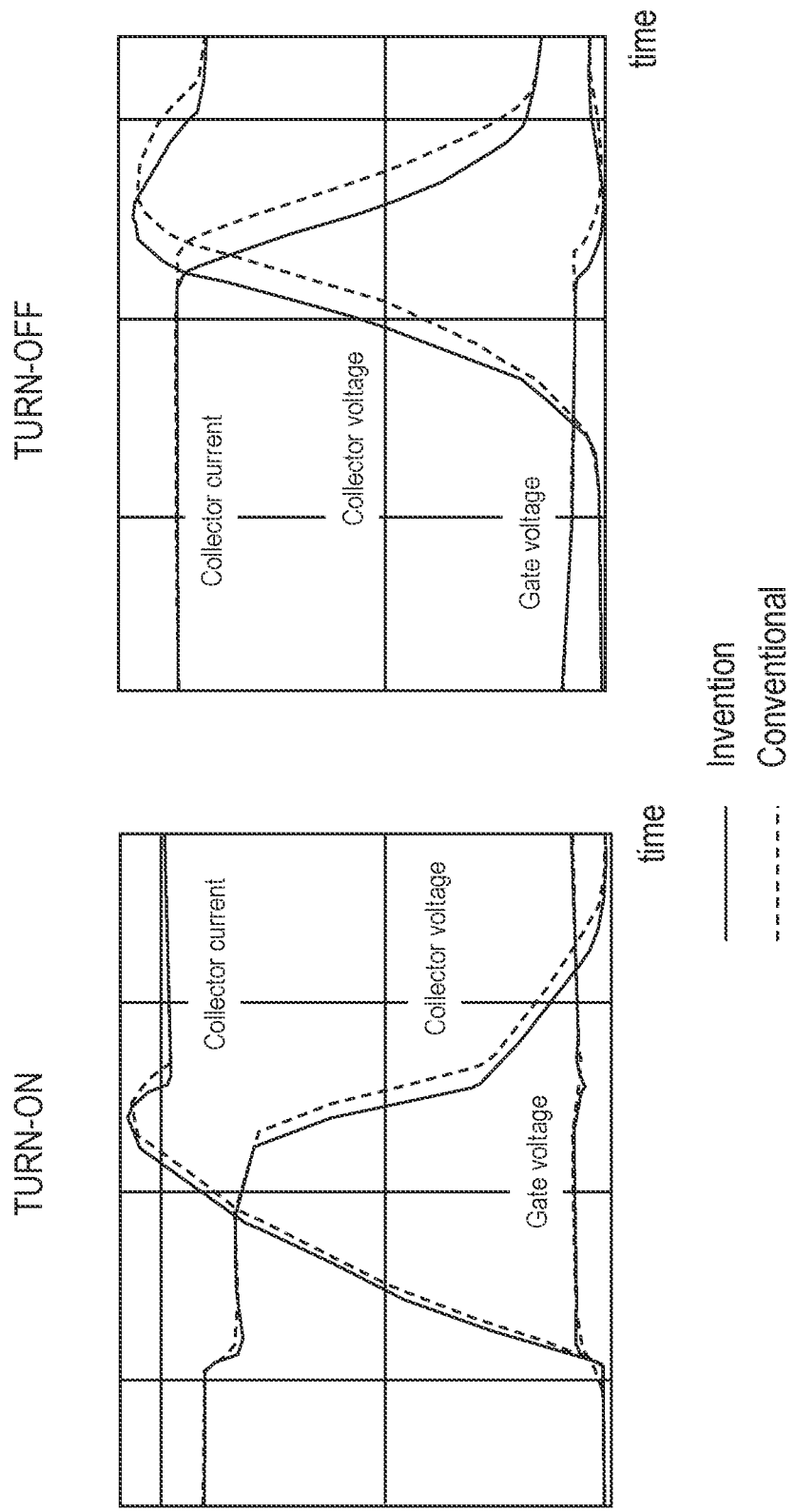
FIG. 7 is a diagram for explaining the semiconductor device of the first embodiment.

FIG. 7 is the result of simulating the turn-on and turn-off characteristics by TCAD for the structure of "f" in FIG. 4. Both characteristics are speeded up as compared with the prior art.

As described above, in the semiconductor device 100 of the first embodiment, the trench gate 5 and the trench emitter 6 (6-1) are formed in the active cell region, and further, the trench emitter 6 (6-2) is formed in the vicinity of the trench gate 5 in the inactive cell region. The p+ type floating layer is formed between the trench gate 5 and the trench emitter 6-2. This makes it possible suppress the self-turn-on phenomenon, improve the response speed to the gate voltage, speed up the turn-off, and mitigate the electric field at the bottom of the trench gate.

Second Embodiment (Configuration of Semiconductor Device)

Figure 8:
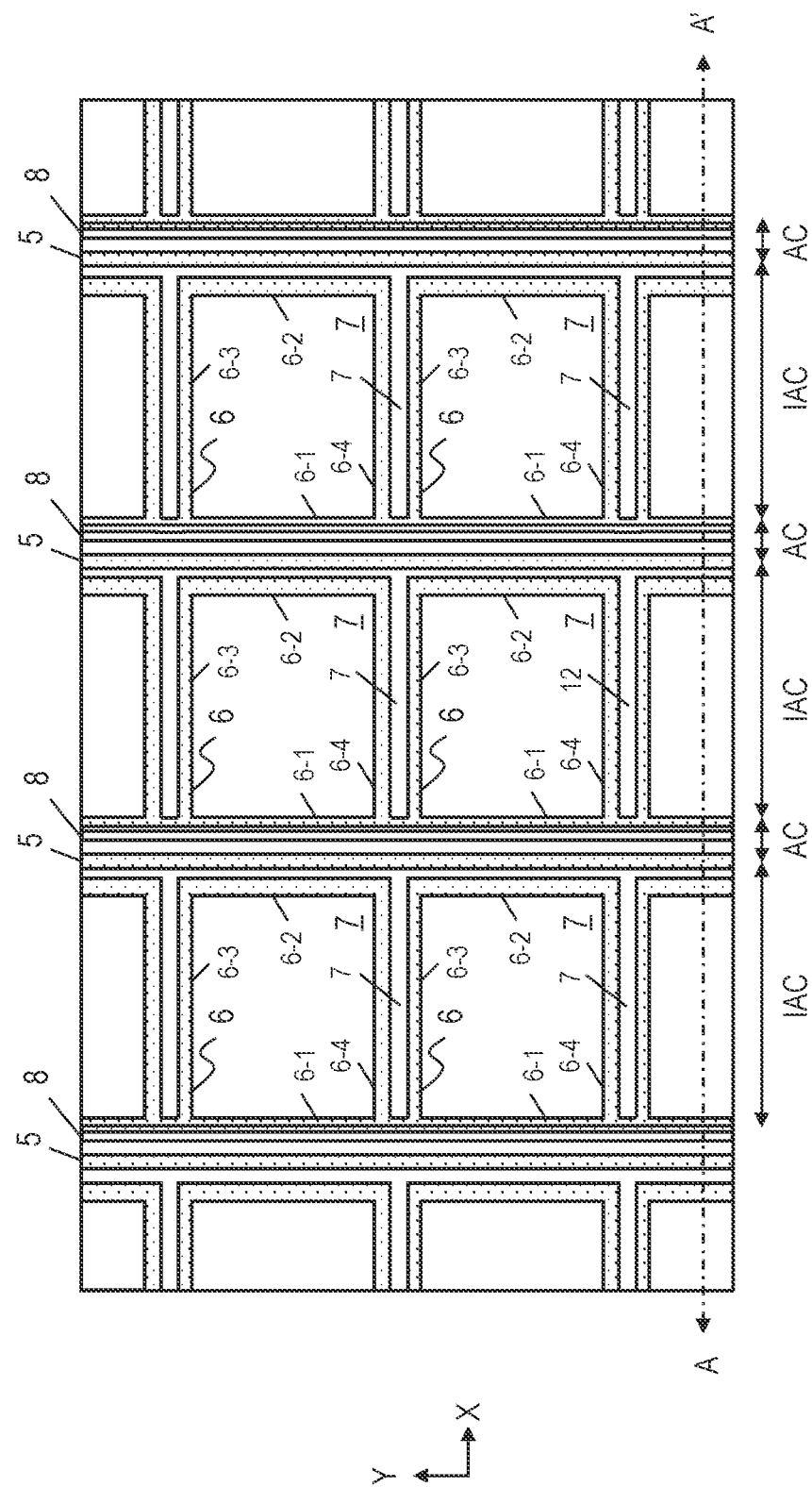
FIG. 8 is a plan view of a semiconductor device of a second embodiment.

FIG. 8 is an view of a semiconductor device of a second embodiment. FIG. 8 is an enlarged plan view of the region 4 of FIG. 1. In the second embodiment, similarly to the first embodiment, the trench emitter 6 has square trench emitters 6-1 to 6-4. However, adjacent trench emitters 6-1 in the Y-axis direction are connected to be a continuous shape. The difference from the first embodiment (FIG. 2) is that the n+ type hole barrier layer 12 is not formed between the trench emitters 6-3 and 6-4. The p+ type floating layer 7 is formed between the trench emitters 6-3 and 6-4.

Since no n+ type hole barrier layer 12 is formed between the trench emitters 6-3 and 6-4, the parasitic Pch-type MOSFET described in the first embodiment is not formed around the trench emitters 6-3 and 6-4. The parasitic P-ch1 type MOSFET is formed around the trench emitter 6-1.

In the second embodiment, since the region in which the parasitic Pch-type MOSFET is formed is narrower than in the first embodiment, the second embodiment is suitable for an application in which high-speed turn-off is not necessary. Even in this case, it is possible to obtain the effects of suppression of the self-turn-on phenomenon, improvement of the response speed to the gate voltage, and electric field mitigation of the bottom portion of the trench gate described in the first embodiment.

As described above, in the semiconductor device of the second embodiment, the same effects as that of the first embodiment can be obtained, but in particular, by employing the semiconductor device in an application in which high-speed turn-off is unnecessary, the semiconductor device can exhibit the effect more effectively.

Third Embodiment (Configuration of Semiconductor Device)

Figure 9:
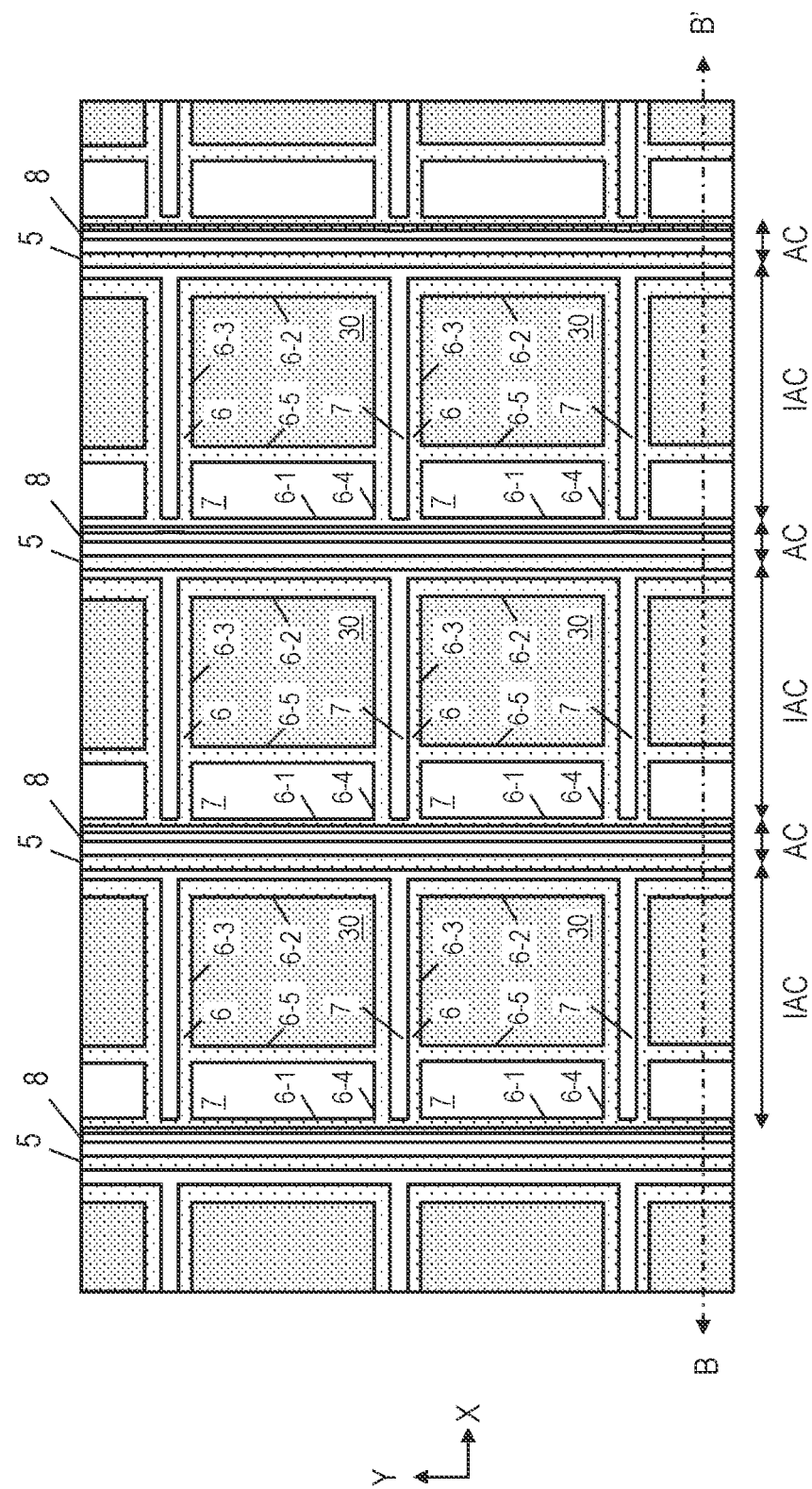
FIG. 9 is a plan view of the semiconductor device of a third embodiment.

FIG. 9 is a plan view of a semiconductor device of a third embodiment. FIG. 9 is an enlarged plan view of the region 4 of FIG. 1. In the third embodiment, like the second embodiment, the trench emitter 6 has the square shape including the trench emitters 6-1 to 6-4 and further including trench emitter 6-5.

The trench emitter 6-5 extend in the Y-axis direction so as to connect the trench emitters 6-3 and 6-4.

Figure 10:
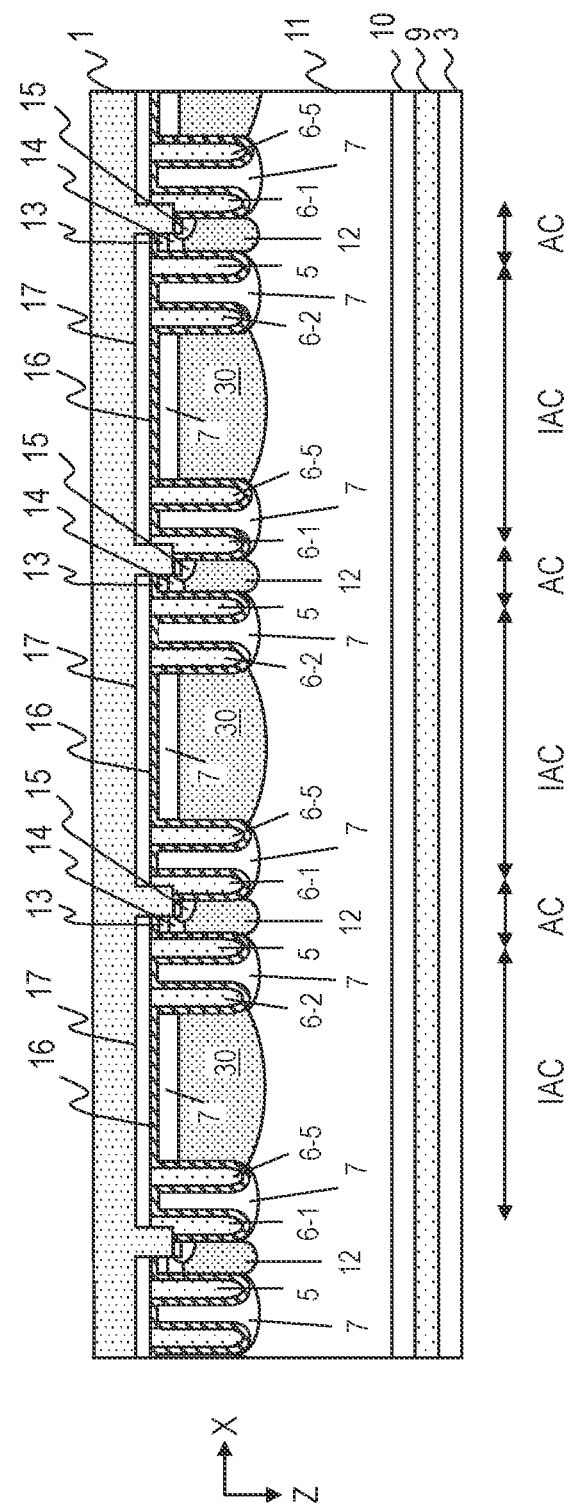
FIG. 10 is a cross-sectional view of the semiconductor device of the third embodiment.

FIG. 10 is a cross-sectional view taken along B-B' of FIG. 9. The difference between the embodiments 1 and 2 is that the p+ type floating layer 7 is divided into a p+ type floating layer 7 (first floating layer) located between the trench gate 5 and the trench emitter 6-2, a p+ type floating layer 7 (second floating layer) located between the trench emitters 6-2 and 6-5, and a p+ type floating layer 7 (third floating layer) located between the trench emitters 6-1 and 6-5. An n+ type diffusion layer 30 is formed under the second floating layer.

The first to third floating layers enhance the carrier accumulation effect and the IE effect as in the conventional case. The difference from the prior art is that a parasitic Pch-type MOSFET is not formed in the first and second floating layers. Since the parasitic Pch-type MOSFET in the third floating layer as in the prior art is formed, a path for discharging the accumulated carriers to the emitter electrode is formed. That is, the third floating layer has both a function of storage and discharging carriers. On the other hand, since the carrier discharge path is not formed in the first and second floating layers, the first and second floating layers are kept in a completely floating state. That is, can be said that the first and second floating layers are specialized in a carrier accumulation function (IE effect). Therefore, the third embodiment is more suitable for an application requiring a reduction in VCE (Sat) by increasing the IE effect than the speed-up of the turn-off by discharging the carrier.

Needless to say, the same effects as those of the first embodiment can be obtained in the third embodiment.

As described above, in the semiconductor device of the third embodiment, the same effects as that of the first embodiment can be obtained. In particular, the effects can be exhibited by adopting the semiconductor device in an application requiring the IE effect improvement rather than the high-speed turn-off.

It should be noted that the present invention is not limited to the above-mentioned embodiments, and various modifications can be made without departing from the gist thereof.

What is claimed is:

1. A semiconductor device, comprising:
   a semiconductor substrate having a first surface and a second surface opposite to the first surface; and
   a drift layer of a first conductivity type formed on the semiconductor substrate,
   wherein the semiconductor substrate has first and second active cell regions, and an inactive cell region between the first and second active cell regions,
   wherein each of the first and second active cell regions comprises:
      a trench gate formed on the first surface side;
      a first trench emitter formed adjacent to the trench gate on the first surface side;
      a first hole barrier layer of the first conductivity type formed on upper portion of the drift layer and between the trench gate and the first trench emitter;
      a base layer of a second conductivity type opposite to the first conductivity type formed on upper portion of the first hole barrier layer and in contact with the trench gate;
      an emitter layer of the first conductivity type formed on upper portion of the base layer and in contact with the trench gate; and
      a latch-up prevention layer of the second conductivity type formed on upper portion of the first hole barrier layer and in contact with the first trench emitter,
   wherein the inactive cell region comprises:
      a second trench emitter formed adjacent to the trench gate of the first active region on the first surface side; and
      a first floating layer of the second conductivity type formed between the trench gate of the first active cell region and the second trench emitter.

2. The semiconductor device according to claim 1, wherein the first floating layer is also formed between the second trench emitter and the first trench emitter of the second active cell region.

3. The semiconductor device according to claim 2, wherein the inactive cell region further includes third and fourth trench emitters formed on the first surface side, wherein the trench gate and the first and second trench emitters extend in a first direction in a plan view, wherein the third and fourth trench emitters extend in a second direction perpendicular to the first direction in a plan view, and wherein the second trench emitter and the first trench emitter of the second active cell region is connected to the third and fourth trench emitters so as to be square in a plan view.

4. The semiconductor device according to claim 3, wherein the inactive cell region has first and second inactive cell regions adjacent to each other in the first direction in a plan view, and wherein a second hole barrier layer of the first conductivity type is formed between the fourth trench emitter of the first inactive cell region and the third trench emitter of the second inactive cell region.

5. The semiconductor device according to claim 4, wherein a parasitic P-channel MOSFET is formed by the latch-up prevention layer, the first hole barrier layer and the first floating layer, and wherein a parasitic P-channel MOSFET is formed by the latch-up prevention layer, the second hole barrier layer and the first floating layer.

6. The semiconductor device according to claim 3, wherein the inactive cell region has first and second inactive cell regions adjacent to each other in the first direction in a plan view, and wherein the first trench emitter of the first inactive cell region is connected to the first trench emitter of the second inactive cell region so as to have a shape extending continuously in the first direction.

7. The semiconductor device according to claim 3, wherein the inactive cell region further comprises a fifth emitter trench formed on the first surface side and between the first and second trench emitters, and wherein the fifth trench emitter extends in the first direction in a plan view and is connected to the third and fourth trench emitters.

8. The semiconductor device according to claim 7, wherein the inactive cell region further comprising:
   a second floating layer of the second conductivity type formed between the second trench emitter and the fifth trench emitter, and
   a third floating layer of the second conductivity type formed between the first trench emitter and the fifth trench emitter.

9. The semiconductor device according to claim 8, wherein a floating layer of the first conductivity type is formed on lower portion of the second floating layer.

10. The semiconductor device according to claim 8, wherein a parasitic P-channel MOSFET is formed by the latch-up prevention layer, the first hole barrier layer and the third floating layer.

11. The semiconductor device according to claim 2, wherein a depth of the second trench emitter from the first surface is shallower than a depth of the first floating layer from the first surface.

12. The semiconductor device according to claim 2, wherein a parasitic P-channel MOSFET is formed by the latch-up prevention layer, the first hole barrier layer and the first floating layer.

13. The semiconductor device according to claim 1, wherein a distance between the second trench emitter and the trench gate of the first active cell region is shorter than a distance between the second trench emitter and the first trench emitter of the second active cell region.

* * * * *